(12) United States Patent
Weiner (10) Patent No.: US 10,903,145 B2
(45) Date of Patent: Jan. 26, 2021

(54) SYMMETRIC INPUT CIRCUITRY FOR IC IN TWO-PIN PACKAGE

(71) Applicant: Microchip Technology Incorporated, Chandler, AZ (US)

(72) Inventor: Albert Weiner, Colorado Springs, CO (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 16/177,473

(22) Filed: Nov. 1, 2018

(65) Prior Publication Data

US 2019/0131215 A1   May 2, 2019

Related U.S. Application Data

(60) Provisional application No. 62/580,515, filed on Nov. 2, 2017.

(51) Int. Cl.
| | | |
|---|---|---|
| *H03K 17/687* | (2006.01) | |
| *H01L 23/495* | (2006.01) | |
| *H01L 27/02* | (2006.01) | |
| *H03K 17/693* | (2006.01) | |
| *H03K 5/24* | (2006.01) | |
| *H03K 19/20* | (2006.01) | |

(52) U.S. Cl.
CPC .... *H01L 23/49517* (2013.01); *H01L 27/0248* (2013.01); *H03K 5/2472* (2013.01); *H03K 17/6874* (2013.01); *H03K 17/693* (2013.01); *H03K 19/20* (2013.01)

(58) Field of Classification Search
CPC .......... H01L 23/49517; H01L 27/0248; H03K 17/6874; H03K 19/20; H03K 5/2472; H03K 17/693
See application file for complete search history.

(56) References Cited

U.S. PATENT DOCUMENTS

| | | | |
|---|---|---|---|
| 4,139,880 A | 2/1979 | Ulmer et al. | ................. 361/246 |
| 6,283,776 B1 * | 9/2001 | Gressly | .............. H01R 13/7031 200/51.1 |

(Continued)

FOREIGN PATENT DOCUMENTS

CN         101557122 B    12/2010    ............... G05F 1/10

OTHER PUBLICATIONS

Partial International Search Report and Invitation to Pay Additional Fees, Application No. PCT/US2018/058864, 16 pages, dated Apr. 1, 2019.

(Continued)

*Primary Examiner* — Marcos D. Pizarro
*Assistant Examiner* — Sue Tang
(74) *Attorney, Agent, or Firm* — Slayden Grubert Beard PLLC (57) ABSTRACT

An integrated circuit device is disclosed, which integrated circuit device comprises at least a first external contact, a second external contact, and an input stage, connected with the external contacts and being configured to provide an internal operating voltage when an external voltage is applied to the external contacts. To allow easier handling at manufacture, test, assembly, and end use, the internal operating voltage has a predefined polarity, which predefined polarity is independent of the polarity of the external voltage.

22 Claims, 4 Drawing Sheets

(56) References Cited

U.S. PATENT DOCUMENTS

| | | | |
|---|---|---|---|
| 6,550,046 B1* | 4/2003 | Balasa | G06F 17/5072 |
| | | | 716/122 |
| 2005/0040873 A1* | 2/2005 | Wada | H03K 3/012 |
| | | | 327/215 |
| 2005/0195540 A1* | 9/2005 | Streibl | H01L 27/0259 |
| | | | 361/56 |
| 2005/0200998 A1* | 9/2005 | Rowan | G11B 33/122 |
| | | | 360/69 |
| 2010/0259240 A1* | 10/2010 | Cuk | H02M 1/4208 |
| | | | 323/299 |
| 2011/0080761 A1* | 4/2011 | Kung | H02M 7/219 |
| | | | 363/127 |
| 2012/0286683 A1* | 11/2012 | Radermacher | H05B 45/37 |
| | | | 315/201 |
| 2013/0305066 A1* | 11/2013 | Mullins | G06F 1/26 |
| | | | 713/310 |
| 2014/0285239 A1 | 9/2014 | Zanetta et al. | 327/64 |
| 2016/0308355 A1 | 10/2016 | Price et al. | 307/64 |

OTHER PUBLICATIONS

International Search Report and Written Opinion, Application No. PCT/US2018/058864, 22 pages, dated May 24, 2019.

* cited by examiner

SYMMETRIC INPUT CIRCUITRY FOR IC IN TWO-PIN PACKAGE

CROSS REFERENCE TO RELATED PATENT APPLICATION

This application claims priority to U.S. Provisional Patent Application No. 62/580,515 filed Nov. 2, 2017, the entire contents of which are hereby incorporated by reference for all purposes.

FIELD OF THE INVENTION

The present disclosure relates to integrated circuit devices and, more particularly, to integrated circuit devices in two-pin housing.

BACKGROUND

For various applications, semiconductor devices in a so-called "one-wire configuration" are available. These types of semiconductor devices have two contacts to interface with outside components. Typically, a ground (GND) connection and a connection for power, clock, and I/O communication (PWR-I/O-Clk) are given. One purpose of the resulting "one-wire interface" being to reduce the number of connections required, in particular for devices that have a limited functionality.

One housing type, also referred to as package, for these types of devices includes the 2L-DFN type, available from the assignee of the present application. Such a package may allow for pressure contacts, such as spring contacts, to connect to the device.

For various reasons, including cost reasons, the housing or package may be symmetric, which may cause an issue while handling at manufacture, package test, or assembly, which typically requires that the package is oriented correctly. Current solutions include labeling and modifying the package such that one terminal is smaller than the other, or in other ways to make the package asymmetric. However, making the package asymmetric reduces the available footprint for pressure contacts. Labeling is prone to error and also adds additional steps, e.g., when using a typical bowl feeder during assembly, in that image recognition of the label is required.

SUMMARY

Accordingly, an object exists to provide a correspondingly improved integrated circuit device.

The object is solved according to the invention by the subject matter of the independent claims. Any dependent claim and the following description describe embodiments of the invention.

In one aspect, an integrated circuit device is provided. The integrated circuit device comprises at least a first external contact, a second external contact; and an input stage. The input stage is connected with the external contacts and is configured to provide an internal operating voltage when an external voltage is applied to the external contacts, which internal voltage has a predefined polarity, and which predefined polarity is independent of the polarity of the external voltage.

A basic idea of the invention is based on the recognition of the present inventor that a "self-configuring" integrated circuit device may be highly beneficial to avoid the typical drawbacks of semiconductor devices with a one-wire interface. With the setup of the invention, it is not necessary to provide an orientation guide in the form of a label. Also, an elaborate orientation procedure can advantageously be omitted, allowing easier handling at manufacture, test, assembly, and in end use applications.

BRIEF DESCRIPTION OF THE DRAWINGS

The above and other objects, features, and advantages of the current invention will become apparent from the following discussion of various embodiments. In the FIGS.

DETAILED DESCRIPTION

Technical features described in this application can be used to construct various embodiments of integrated circuit devices. Some embodiments of the invention are discussed so as to enable one skilled in the art to make and use the invention.

In a first aspect, an integrated circuit device is provided. The integrated circuit device comprises at least a first external contact, a second external contact, and an input stage. The input stage is connected with the external contacts and is configured to provide an internal operating voltage when an external voltage is applied to the external contacts, which internal voltage has a predefined polarity, and which predefined polarity is independent of the polarity of the external voltage.

In the context of the present explanation, the integrated circuit device may be of any suitable type. For example, the integrated circuit device may be an identification device, such as a SEEPROM device, or an authentication element used within a system. In some embodiments, the integrated circuit device further comprises processing circuitry that provides a defined processing capability, either with hardware "hard-wired" logic, or having a processing core, adapted to provide the processing capability by executing instructions, i.e., software. In some embodiments, the processing circuitry is provided with the internal operating voltage during use. The processing circuitry in that case may be connected with the input stage, the latter also referred to as "input circuitry", in corresponding embodiments.

As discussed in the preceding, the integrated circuit device according to the present aspect comprises at least the first external contact and the second external contact. The contacts may be of any suitable type. For example and in some embodiments, the contacts are pressure contacts, i.e., spring contacts. In alternative embodiments, the contacts are solder contact pads or pins. In some embodiments, the integrated circuit device comprises more than two external contacts. In other embodiments, the integrated circuit device comprises a maximum of two external contacts.

As discussed in the preceding, the integrated circuit device according to the present aspect comprises the input stage. The input stage is connected with the external contacts. The input stage further is configured to provide an internal operating voltage when an external voltage is applied to the external contacts. The internal voltage has a predefined polarity, which is independent of the polarity of the external voltage. In other words, the input stage is self-configuring and provides the internal operating voltage with a fixed polarity to one or more components of the integrated circuit device, such as the aforementioned processing circuitry. Certainly, the input stage may in some embodiments be configured to provide the internal operating voltage to further external components, circuits, etc.

Certainly, the integrated circuit device in some embodiments may comprise additional components, such as a housing, also referred to as package, additional circuitry, such as memory, additional wired or wireless interfaces, etc.

Reference will now be made to the drawings in which the various elements of embodiments will be given numerical designations and in which further embodiments will be discussed.

Specific references to components, modules, units, devices, sections, parts, process steps, and other elements are not intended to be limiting. Further, it is understood that like parts bear the same or similar reference numerals, when referring to alternate figures. It is further noted that the figures are schematic and provided for guidance to the skilled reader and are not necessarily drawn to scale. Rather, the various drawing scales, aspect ratios, and numbers of components shown in the figures may be purposely distorted to make certain features or relationships easier to understand.

Figure 1:
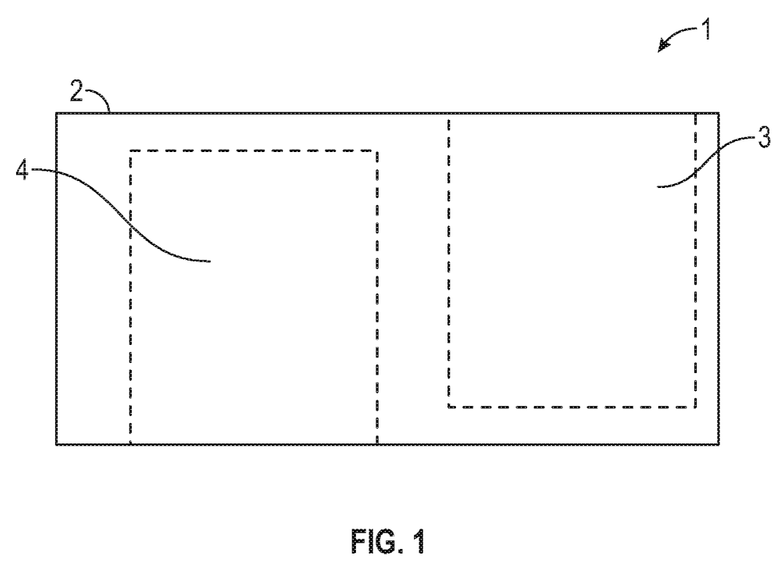
FIG. 1 illustrates an example integrated circuit device in a top view, according to embodiments of the present invention.

FIG. 1 illustrates an exemplary integrated circuit device 1. The device 1 is shown in a top view having a symmetrical housing 2 and a first external contact 3 and a second external contact 4. Both contacts 3, 4 are provided as pressure contacts and are of equal size.

Figure 2:
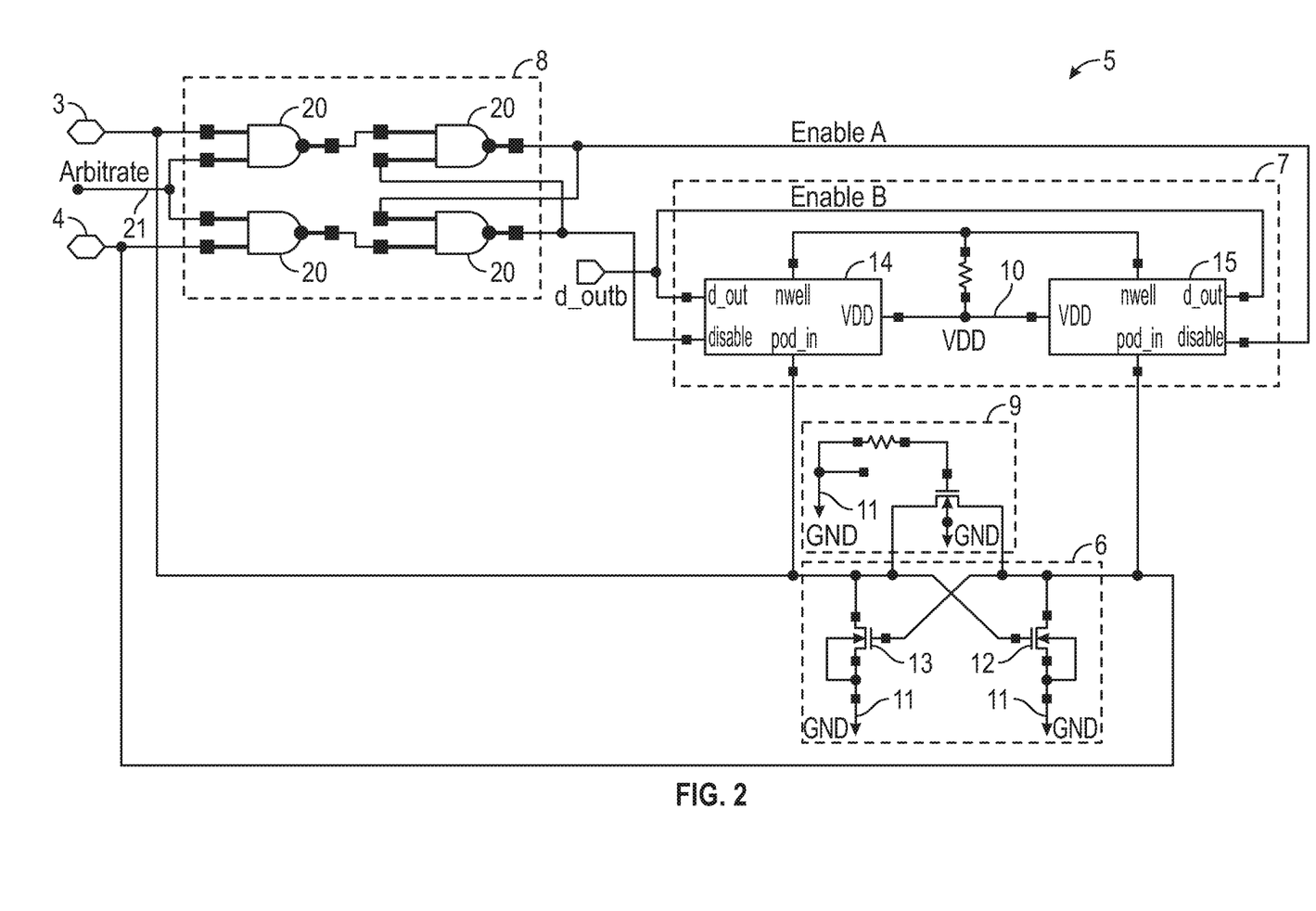
FIG. 2 shows an exemplary circuit diagram of an input stage according to embodiments of the present invention.

FIG. 2 shows an exemplary circuit diagram of an input stage 5 according to embodiments of the present invention. The external contacts 3, 4 are connected to input stage 5 to provide a voltage, applied to the external contacts to the input stage 5. The input stage 5 comprises a ground switch device 6, a supply switch device 7, a latching logic circuit 8, and an electrostatic discharge (ESD) protection circuit 9. As will be apparent from FIG. 2, connections from the external contacts 3, 4 connect to the logic circuit 8 and the ground switch/supply switch devices 6, 7.

As will be apparent, input stage 5 serves to allow that an external voltage can be applied on either contact 3, 4, i.e., with either polarity. In a first polarity, the external positive voltage is applied to contact 3, while contact 4 serves as ground connection. In a second polarity, the external positive voltage is applied to contact 4, while contact 3 serves as ground connection. It is noted, that the contact 3, 4 to which the external voltage is applied during use also is used for communications and clocking of the device 1.

Input stage 5 detects the polarity of the external voltage and provides an internal operating voltage with a predefined polarity, i.e., independent of the polarity of the external voltage. In the present embodiment, an internal operating voltage of 5V is supplied during use to "VDD" rail 10, while the ground is connected to internal ground 11. Once the input stage 5 is configured, the device will retain the polarity setting as long as the internal voltage remains energized. Logic circuit 8 provides this functionality, as is discussed in further detail in the following.

As will be apparent from FIG. 2, ground switch device 6 comprises two relatively large cross-coupled transistors 12, 13. These transistors form the switch to the internal ground 11. Because of the cross-coupling, the high side of the pair of transistors 12, 13 will connect the low side to the internal ground 11. In the schematic of FIG. 2, "GND" represents the internal ground 11 of the integrated circuit device 1. The term "high side" in this context refers to the one of the external contacts 3, 4 that carries the external voltage during use. The term "low side" typically refers to ground.

Bridging the two ground switch transistors 12, 13 is the ESD protection circuit 9. Because there are only two contacts 3, 4 on the device 1, it is necessary to have the ESD 9 shunt between the two contacts 3, 4. The ESD protection circuit 9 is based on transistor snap-back method and is symmetrically laid out to allow discharge from either side. While not shown in the FIG., a portion of the ESD protection circuit 9 can be used as the output driver for outgoing communication. In this case, that part of the transistor used as an output drive would have its gate driven by logic rather than the resistor to ground. This setup avoids an additional area on the IC that would be consumed when a dedicated output device would be used. The ESD protection circuit 9 in this embodiment is a device optimized for both ESD protection and output functions.

The input stage 5 further comprises the supply switch device 7, which comprises two supply switches 14, 15. The supply switches 14, 15 are arranged between the high side and internal power, i.e. the Vdd rail 10. It is noted that the Vdd rail 10 is connected to a load, such as processing circuitry (both not shown), as discussed in the preceding.

At last, the input stage 5 comprises the latching logic circuit 8. Communication with a one-wire device requires that the voltage across the two contacts 3, 4 can be brought to 0V for a short period. During this time, the selection of the high side and low side could be indeterminate.

Therefore, the latching logic circuit provides a state bit that represents which of the contacts 3, 4 was the ground during initial power up. In the schematic of FIG. 2, the state bit is provided by four NAND gates 20. A power-on-reset (POR) generator (not shown) is provided to set an arbitrate line 21 high during initial power up and whenever a new determination of the state bit is desired. Once the internal power is established, the polarity, as determined by the NAND gates 20, is fixed, i.e., until a reset is conducted and arbitrate line 21 is set high.

Figure 3:
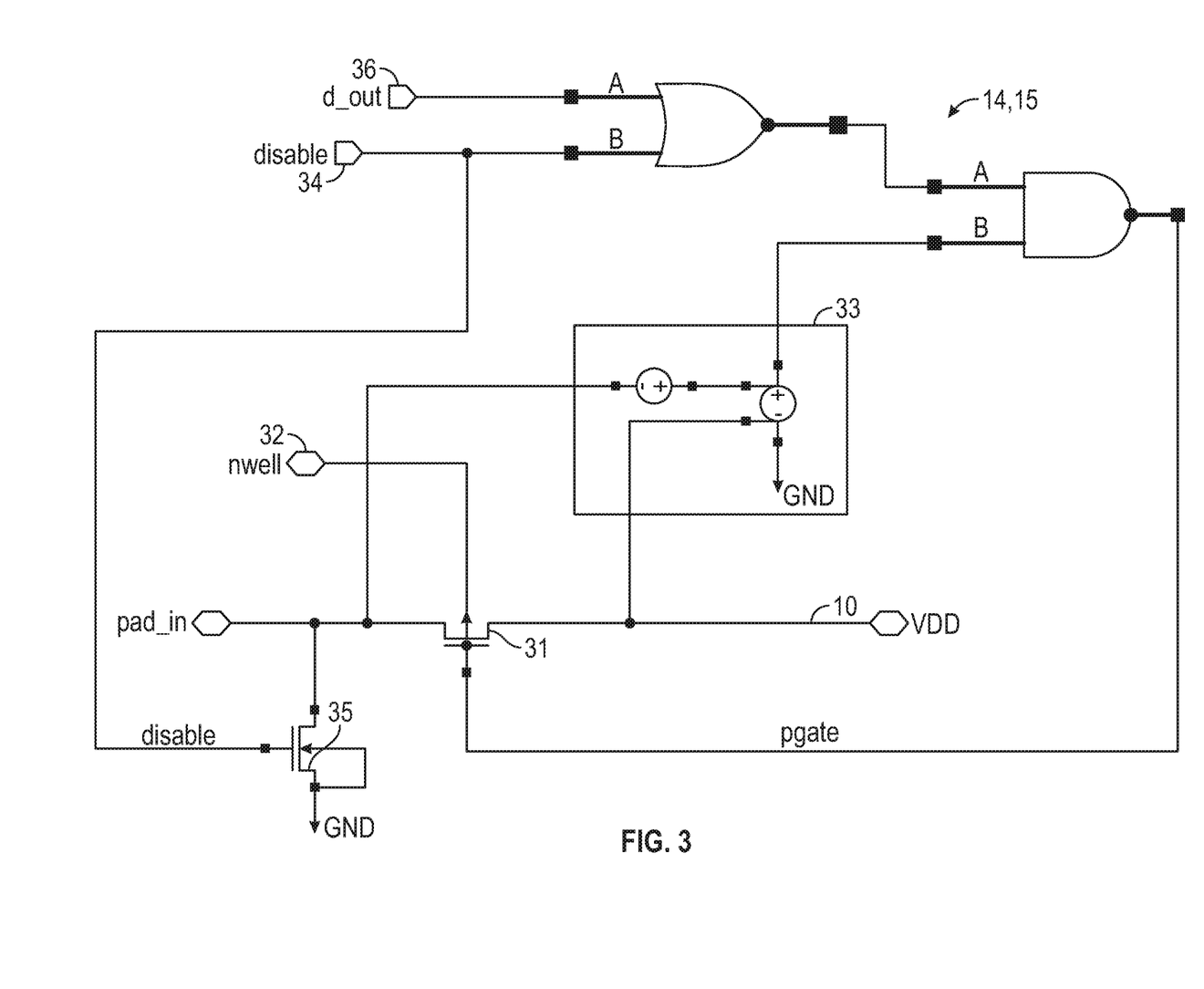
FIG. 3 shows an exemplary circuit diagram of a supply switch according to embodiments of the present invention.

FIG. 3 shows an exemplary circuit diagram of a supply switch 14, 15 according to embodiments of the present invention.

The supply switch 14, 15 is centered on transistor 31, which is a p-FET connecting the high side of the external contacts 3, 4 to the internal VDD rail 10. The well of transistor 31 is connected to the n-well contact 32. As can be seen from FIG. 2, the n-well connection 32 provides a path for initial power-up.

The supply switch 14, 15 further comprises a comparator 33. In the schematic of FIG. 3, the comparator 33 comprises a differential power supply. However, the comparator 33 may be implemented in many different, known forms. The purpose of the comparator 33 is to monitor the voltage difference between the internal VDD rail 10 and the respective high side external contact 3, 4. As long as the high side external contact 3,4 is higher than the VDD rail 33, the comparator 33 will keep the p-FET 31 turned on. However, if the voltage drops below the voltage on the VDD rail 33, the FET 31 is turned off.

This for example is useful when data is being transmitted and the high side is pulled low. There are two additional control pins shown in the schematic of FIG. 3. The disable pin 34 carries the state bit mentioned previously. When high, the disable pin 34 keeps the FET 31 turned off. Shown is also a weak pulldown device, i.e., transistor 35, that holds the low side down when both inputs are at 0V. The second control pin 36, "d_out", allows both supply switches 14, 15 to be turned off when, e.g., the processing circuitry (not shown) is preparing to transmit data.

Figure 4:
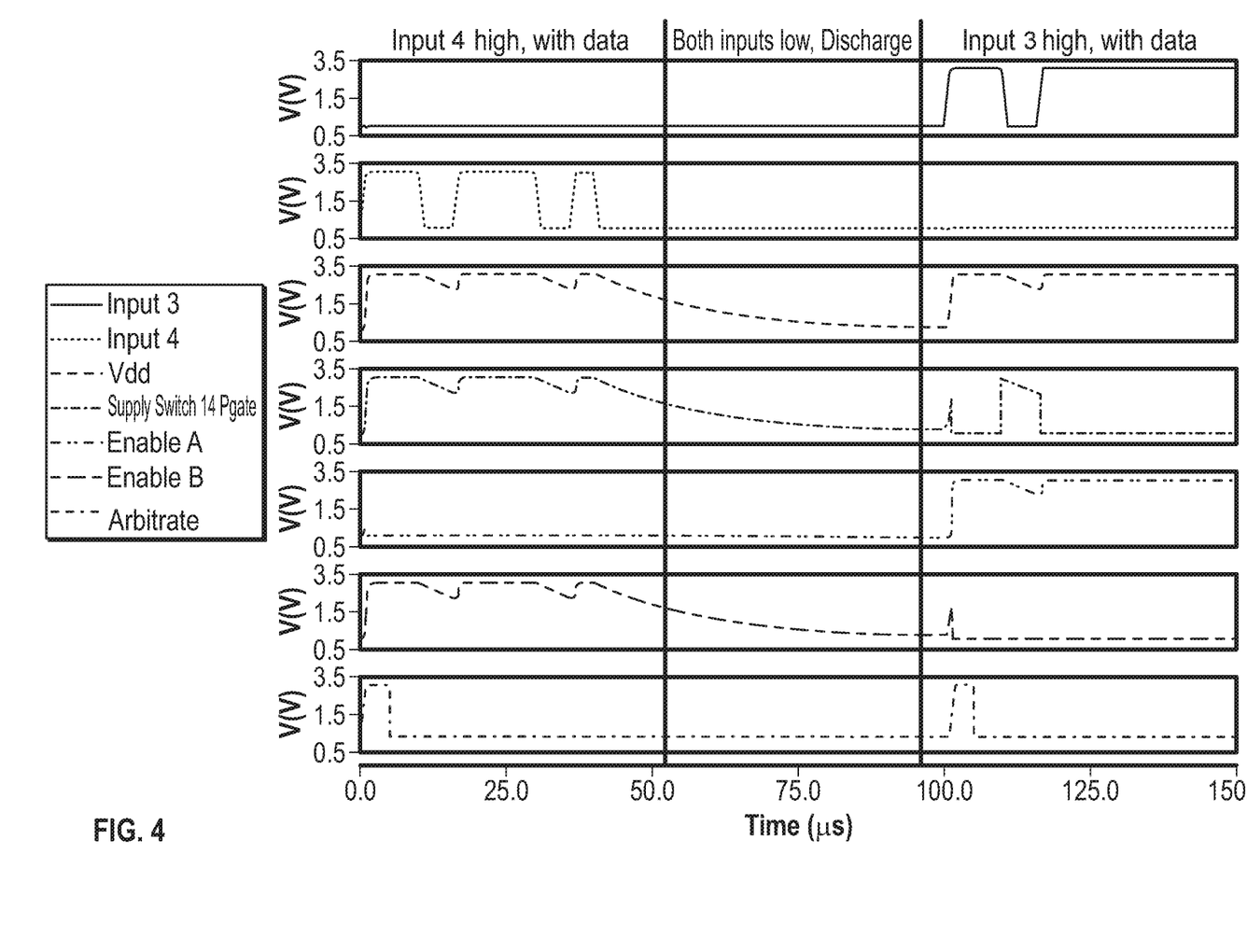
FIG. 4 is a waveform plot showing the operation of the input stage according to the embodiment of FIG. 2.

FIG. 4 is a waveform plot showing the operation of the input stage 5 according to the embodiment of FIG. 2.

FIG. 4 shows multiple operating states of the integrated circuit device 1. In the left third, labeled "Input B high, with data", the second external contact 4 is high and carries an external voltage.

The circuit 1 allows the external voltage to pulse low without loss of charge to VDD. Accordingly, data can be modulated onto the external voltage. At about 40 μs, contact 4 is pulled low and the internal operating voltage is allowed to decay. To demonstrate the symmetric nature of the invention, at 100 μs, the first external contact 3 is brought high, along with the arbitration signal, applied to pin 21 in FIG. 2. From that point forward, VDD is connected to the first external contact 3 and data is received in with pulses on contact 3.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. For example, it is possible to operate the invention in an embodiment in which the supply switches 14, 15 are formed by diodes, instead of using transistors. This will lead to lower overall cost, however, also may limit the operating voltage VDD, as not the full voltage is "transmitted" by a diode.

In the claims, the word "comprising" does not exclude other elements or steps, and the indefinite article "a" or "an" does not exclude a plurality. A single processor, module, or other unit may fulfill the functions of several items recited in the claims.

The mere fact that certain measures are recited in mutually different dependent claims does not indicate that a combination of these measured cannot be used to advantage. Any reference signs in the claims should not be construed as limiting the scope.

ANNEX

The present disclosure relates to semiconductor packaging and interconnects and, more particularly, to symmetric input circuitry for integrated circuits (IC) in two-pin package.

Inventors of embodiments of the present disclosure have discovered shortcomings of ICs. For example, the SHA204 family of devices from the assignee of the present disclosure include a "one-wire configuration". The one-wire interface requires two pins to connect power, input and output, clock, and ground. In some cases, the first three such signals may be connected to a pin and ground may be connected to the other pin. The purpose of the interface is to minimize the number of connections required for a "simple" function.

One package for these devices includes the 2L-DFN, available from the assignee of the present disclosure. Such a package may allow for pressure contacts, such as spring contacts, to connect to the device. During test and during manufacture, an issue may be that the package is symmetric. Handling at manufacture, package test, or assembly requires that the package is oriented correctly. The symmetry can be broken by labeling or by modifying the package such that one terminal is smaller than the other. However, making the package asymmetric reduces the available footprint for pressure contacts. Further, asymmetry may limit the end use application, in which a symmetric package may be advantageous.

FIG. 1 illustrates an example package, according to embodiments of the present disclosure.

Embodiments of the present disclosure may make the internal circuitry able to be connected in either polarity, with internal logic allowing the device to be powered correctly. The internal substrate and ground connection is connected to the low side of the two pins and the internal voltage switch and regulator are connected to the high side. Once configured, the device will retain the pin definition as long as the internal voltage remains energized. Accordingly, the voltage across the input pins will drop to zero during data transmission. Embodiments of the present disclosure may also provide a robust ESD protection solution.

The circuit design may include two portions, the ground switch and the power switches. Both inputs must be able to be connected to either power or ground. The switches are shown in FIG. 2.

Embodiments of the present disclosure may include architectural changes to a front end to allow either pin to be ground. The other pin is PWR-I/O-CLK. This may allow easier handling at test, at assembly and possibly with architecture of final system. These devices are, by their nature, low power. The front end will not be large.

FIG. 2 illustrates switches, according to embodiments of the present disclosure.

The large, cross-coupled transistors, M1 and M2, are the switch to ground. Because of the cross-coupling, the high side of the pair will connect the low side to ground. In the case of this schematic, "GND" represents the internal ground of the chip. The switches between the high side and internal power, called "VDD" in this schematic, are represented by elements IswitchA and IswitchB. The details of those switches will be described in a subsequent paragraph.

Bridging the two ground switch transistors is the ESD protection device, MESD. Because there are only two pins on the device, it is necessary to have the ESD shunt between the two pins. The ESD protection device shown in FIG. 2 is based on transistor snap-back method and is symmetrically laid out to allow discharge from either side. Other ESD protection methods are possible. While not shown in this documentation, it is preferable to use a portion of this ESD device as the output driver. An output device to GND would require the current to also pass through the low-side switch, which would be an unnecessary additional voltage drop.

The ESD may be a single device optimized for both ESD protection and output function.

Communication with a one-wire device requires that the voltage across the two pins be brought to 0V for a short period. During this time the selection of the high side and low side could be indeterminate.

Therefore, there is a state bit required that represents which pin is ground. In this schematic, that state bit is represented by the four NAND gates in the upper left. This logic state, in a real device, would be based on the power-on-reset (POR) function. Once the internal power is established, the polarity of the inputs is fixed.

FIG. 3 shows the functionality of the high side switch, according to embodiments of the present disclosure.

The switch is centered on transistor M7, which is a pfet connecting the high side to internal VDD. The well of M7 is connected to VDD external to the schematic. The well connection provides a path for initial power-up. Within the high-side switch there is a simple comparator. In the schematic this is shown as a differential power supply, but in a real device this could be implemented in many different, known forms. The purpose of the comparator is to monitor the voltage difference between internal VDD and the external high pin. As long as the external pin is higher than VDD, the comparator will keep the pfet turned on. However, if the pin voltage drops below VDD, the pfet is turned off. This will happen when data is being transmitted and the high side is pulled low. There are two additional control signals brought into schematic B. The disable signal is the state bit mentioned previously. When high, the disable bit keeps the pfet turned off. There is also a weak pulldown device, M0, that holds the low side down when both inputs are at 0V. The second control bit, d_out, allows both sides to be turned off when the chip is preparing to transmit data.

In concept, the high-side switch is a diode to VDD, and could be built as such. However, a diode will not transmit full voltage to VDD, and as such, will limit the minimum operating voltage of the chip. A p-n diode also has a significant parasitic bipolar component that reduces the efficiency of the system by shunting much of the current intended for VDD directly to gnd.

FIG. 4 is a waveform plot showing the operation of the block, according to embodiments of the present disclosure. Transient response is used.

In the first half, side B is high and the circuitry allows B to pulse low without loss of charge to VDD (pulldown resistor in test bench represents tile internal current in the chip and causes the drop in VDD). At 40 us the B side is pulled low and the internal voltage is allowed to decay. At 100 us the A side is brought high, along with tile arbitration signal.

From that point forward, VDD is connected to the A side and data comes in with pulses on A.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

In one embodiment, an integrated circuit package, comprises a first end; a second end; and switches embedded in the package to selectively apply a ground to one of the first end and the second end and apply a clock/input-output/power to the other of the first end and the second end.

What is claimed is:

1. An integrated circuit device, comprising at least:
a one-wire interface having a first external contact and a second external contact, which one-wire interface is configured to provide power, data, and ground connections when in use; and
a self-configuring input stage, connected with the external contacts and being configured to provide an internal DC operating voltage when an external DC voltage is applied to the external contacts, which internal DC operating voltage has a predefined polarity, and which predefined polarity is independent of the polarity of the external DC voltage.

2. The integrated circuit device of claim 1, comprising a maximum of two external contacts.

3. The integrated circuit device of claim 1, further comprising a housing, which housing is symmetrical with respect to at least one axis of the housing and which housing comprises the one-wire interface.

4. The integrated circuit device of claim 1, wherein the external contacts are pressure contacts.

5. The integrated circuit device of claim 1, further comprising an electrostatic protection circuit, connected between the first external contact and the second external contact.

6. The integrated circuit device of claim 1, wherein the self-configuring input stage comprises a ground switch device, which ground switch device is connected with the first and second external contacts, and which ground switch device is configured to connect one of the first and second external contacts with an internal ground.

7. The integrated circuit device of claim 6, wherein the ground switch device comprises at least a first and a second ground switch, wherein the first ground switch is arranged to allow a connection of the first external contact with the internal ground and the second ground switch is arranged to allow a connection of the second external contact with the internal ground.

8. The integrated circuit device of claim 7, wherein the first and second ground switches are cross-coupled, so that a voltage, applied to the first external contact connects the second external contact with the internal ground and a voltage, applied to the second external contact connects the first external contact with the internal ground.

9. The integrated circuit device of claim 7, wherein the first and second ground switches are semiconductor switches.

10. The integrated circuit device of claim 1, wherein the self-configuring input stage comprises a supply switch device, which supply switch device is connected with the first and second external contacts, and which supply switch device is configured to connect one of the first and second external contacts with an internal power supply line.

11. The integrated circuit device of claim 10, wherein the supply switch device comprises at least a first and a second supply switch, wherein the first supply switch is arranged to allow a connection of the first external contact with the internal power supply line and the second supply switch is arranged to allow a connection of the second external contact with the internal power supply line.

12. The integrated circuit device of claim 10, wherein the first and a second supply switches are semiconductor switches.

13. The integrated circuit device of claim 10, wherein the supply switch device comprises a latching logic circuit, which latching logic circuit upon receiving a reset signal, determines the polarity of the external voltage, applied to the first and second external contacts during use and provides polarity information to the first and second supply switches.

14. The integrated circuit device of claim 13, wherein the latching logic circuit maintains the polarity information until receiving a further reset signal.

15. The integrated circuit device of claim 13, wherein the latching logic circuit maintains the polarity information independent of the external voltage being present at the first and/or second external contacts.

16. The integrated circuit device of claim 13, wherein the latching logic circuit comprises NAND gates.

17. The integrated circuit device of claim 13, wherein the latching logic circuit comprises a power-on-reset generator.

18. The integrated circuit device of claim 10, further comprising processing circuitry, wherein the supply switch device is connected with the processing circuitry to receive a data transmission signal, and wherein the supply switch device disconnects both, the first and the second external contact from the internal power supply line in dependence of the data transmission signal.

19. The integrated circuit device of claim 1, further comprising processing circuitry, wherein the processing circuitry is configured to transmit data to and receive data from a host device, connected with the integrated circuit device during use via the first and second external contacts.

20. The integrated circuit device of claim 1, wherein
the self-configuring input stage comprises a ground switch device, which ground switch device is connected with the first and second external contacts, and which ground switch device is configured to connect one of the first and second external contacts with an internal ground; and
wherein the self-configuring input stage comprises a supply switch device, which supply switch device is connected with the first and second external contacts, and which supply switch device is configured to connect one of the first and second external contacts with an internal power supply line.

21. A self-configuring input stage for a one-wire integrated circuit device, the self-configuring input stage being connectable to a one-wire interface having a first external contact and a second external contact, which one-wire interface is configured to provide power, data, and ground connections when in use; wherein the self-configuring input stage being configured to provide a DC operating voltage when an external DC voltage is applied to the external contacts, which DC operating voltage has a predefined polarity, and which predefined polarity is independent of the polarity of the external DC voltage.

22. An integrated circuit device, comprising at least:
a first external contact;
a second external contact; and
an input stage, connected with the external contacts and being configured to provide an internal operating voltage when an external voltage is applied to the external contacts, which internal operating voltage has a predefined polarity, and which predefined polarity is independent of the polarity of the external voltage; wherein
the input stage comprises a supply switch device, which supply switch device is connected with the first and second external contacts, and which supply switch device is configured to connect one of the first and second external contacts with an internal power supply line; wherein
the supply switch device comprises a latching logic circuit, which latching logic circuit upon receiving a reset signal, determines the polarity of the external voltage, applied to the first and second external contacts during use and provides polarity information to the first and second supply switches;
wherein
the latching logic circuit maintains the polarity information until receiving a further reset signal.

* * * * *